(12) United States Patent
Asakawa et al.

(10) Patent No.: US 7,982,235 B2
(45) Date of Patent: Jul. 19, 2011

(54) LIGHT EMITTING DEVICE, PACKAGE AND LEAD FRAME

(75) Inventors: Hideo Asakawa, Anan (JP); Takeo Kurimoto, Anan (JP)

(73) Assignee: Nichia Corporation, Anan-shi (JP)

( * ) Notice: Subject to any disclaimer, the term of this patent is extended or adjusted under 35 U.S.C. 154(b) by 182 days.

(21) Appl. No.: 12/024,344

(22) Filed: Feb. 1, 2008

(65) Prior Publication Data

US 2008/0191327 A1 Aug. 14, 2008

(30) Foreign Application Priority Data

Feb. 14, 2007 (JP) ................................. 2007-032796

(51) Int. Cl.
*H01L 33/00* (2010.01)
*H01L 23/48* (2006.01)
*H01L 23/52* (2006.01)
*H01L 29/40* (2006.01)

(52) U.S. Cl. .......... 257/99; 257/690; 257/696; 257/773; 257/E23.048; 257/81

(58) Field of Classification Search .................. 257/666, 257/99, 696, 675, 690, 773, E23.047, E23.048, 257/81
See application file for complete search history.

(56) References Cited

U.S. PATENT DOCUMENTS

| 5,225,897 | A  | * | 7/1993  | Reifel et al. ................ 257/787 |
| 5,912,592 | A  | * | 6/1999  | Kikushima ................... 331/68 |
| 6,953,952 | B2 | * | 10/2005 | Asakawa ..................... 257/103 |
| 6,984,539 | B2 | * | 1/2006  | Yoon .............................. 438/29 |
| 7,176,473 | B2 | * | 2/2007  | Aki et al. ..................... 250/551 |
| 7,393,122 | B2 | * | 7/2008  | Tsuzuki et al. ............... 362/304 |
| 2004/0046242 | A1 | * | 3/2004 | Asakawa ..................... 257/678 |
| 2005/0116145 | A1 | * | 6/2005 | Aki et al. ..................... 250/214.1 |
| 2005/0238074 | A1 | * | 10/2005 | Matsushita et al. ........ 372/43.01 |
| 2005/0285505 | A1 | * | 12/2005 | Jeganathan et al. .......... 313/500 |
| 2006/0055012 | A1 | * | 3/2006 | Hsin Chen et al. ........... 257/678 |
| 2006/0108669 | A1 | * | 5/2006 | Matsumoto et al. ......... 257/666 |
| 2006/0163705 | A1 | * | 7/2006 | Kamikawa et al. ........... 257/676 |

FOREIGN PATENT DOCUMENTS

| JP | H06-017248 U | | 3/1994 |
| JP | 2003-168824 A | | 6/2003 |
| JP | 2003168824 A | * | 6/2003 |
| JP | 2006-019313 A | | 1/2006 |

* cited by examiner

*Primary Examiner* — Minh-Loan T Tran
*Assistant Examiner* — Teresa M Arroyo
(74) *Attorney, Agent, or Firm* — Global IP Counselors, LLP

(57) ABSTRACT

The semiconductor device includes a semiconductor element, a lead frame electrically connected to the semiconductor element, and a package having an opening in a front surface with a part of the lead frame protruding from a bottom surface. The protruding lead frame branches into a plurality of end portions, and the end portions are bent to be positioned respectively on a side surface and one of a back surface and a bottom surface of the package.

10 Claims, 4 Drawing Sheets

LIGHT EMITTING DEVICE, PACKAGE AND LEAD FRAME

CROSS-REFERENCE TO RELATED APPLICATIONS

This application claims priority to Japanese Patent Application No. 2007-32796 filed on Feb. 14, 2007. The entire disclosure of Japanese Patent Application No. 2007-32796 is hereby incorporated herein by reference.

BACKGROUND OF THE INVENTION

1. Field of the Invention

The present invention relates to a light emitting device and a light receiving device, which is used for an optical sensor and the like, employing a semiconductor element. More particularly, the present invention relates to a thin-type light emitting device used for a backlight of a liquid crystal display and the like.

2. Background Information

Semiconductor light emitting devices of high luminance and high optical output have been developed and utilized in various fields. Making use of its advantage, such as small size, low electrical consumption, and light weight, such light emitting devices have been used as, for example, a light source of a cellular phone and a backlight of a liquid crystal display, a light source of various meters, various read sensors, signaling devices, illuminations, or the like. As one of the light emitting devices used for such purposes, a thin-type light emitting device having a light emitting element disposed in a flat resin package has been known. In such light emitting devices, a lead terminal protruding from the bottom surface of the package is bent along the bottom surface of the package, and is further bent along a side surface of the package.

However, in the light emitting devices described in Japanese Laid Open Patent Publication No. 2003-168824 and Japanese Laid Open Patent Publication No. 2006-19313, the lead terminal to be soldered to a mounting substrate and the like and is capable of forming a fillet (hereinafter referred to as a fillet terminal) is only provided at each of a pair of side surfaces, and consequently, heat can be removed substantially only from the mounting surface of the soldered fillet terminals, resulting in insufficient heat dissipation.

When such a light emitting device is incorporated into an optical member such as an optical waveguide and the like, a resin portion of the back surface of the package is pressed by means of an elastic member so that the opening side of the package is closely adhered to the optical waveguide. Insufficient dimensional accuracy of the package may lead the resin incorporated therein being distorted, resulting in the semiconductor device being operated under stress, so that the reliability may be reduced due to consequent vibration or the like.

SUMMARY OF THE INVENTION

An object of the present invention is to provide a semiconductor device which significantly improves heat dissipation and is capable of operating without being subjected to the stress even when it is incorporated in an optical member such as an optical waveguide.

To accomplish above, a semiconductor device according to one aspect of the present invention comprises a semiconductor element, a lead frame to which the semiconductor element is electrically connected, and a package having an opening in a front surface and a part of the lead frame protruding from a bottom surface. The protruding lead frame branches into a plurality of end portions, and the end portions are bent to be positioned respectively on a side surface and a back surface of the package.

A semiconductor device according to another aspect of the present invention comprises a semiconductor element, a lead frame to which the semiconductor element is electrically connected, and a package having an opening in a front surface and a part of the lead frame protruding from a side surface. The protruding lead frame branches into a plurality of end portions, and the end portions are bent to be positioned respectively on a bottom surface and a back surface of the package.

In such semiconductor devices, the surface area of the end portions disposed at the back surface is preferably larger than that of the end portions disposed at the side surface or the bottom surface.

In the semiconductor devices according to the present invention, the lead frame has a plurality of end portions and a large surface area, so that heat dissipation can be significantly improved. Also, the end portions of the lead frame can be loaded with a stress, so that even in the case where the semiconductor device is incorporated into an optical member such as an optical waveguide, it can be operated without the package body being substantially subjected to the stress.

BRIEF DESCRIPTION OF THE DRAWINGS

FIG. 1A is a perspective view as seen from a front surface side, FIG. 1B is a perspective view seen from a back surface side, FIG. 1C is a perspective view of a lead frame portion of the semiconductor light emitting device shown in FIG. 1A and FIG. 1B, and FIG. 1D is a bottom view.

FIG. 2A is a bottom view, FIG. 2B is a back view, FIG. 2C is a side view, FIG. 2D is a plan view, and FIG. 2E is a front view.

FIG. 3A is a bottom view, FIG. 3B is a back view, FIG. 3C is a side view, FIG. 3D is a plan view, and FIG. 3E is a front view.

DETAILED DESCRIPTION OF THE PREFERRED EMBODIMENTS

The preferred embodiments of the present invention will be described below. Herein, the embodiments described below illustrate a semiconductor device embodying the technological idea of the invention and the semiconductor device according to the present invention is not limited thereto.

Furthermore, it should be appreciated that the parts and members shown in claims attached hereto are not specifically limited to the parts and members in the embodiments. Unless otherwise specified, the sizes, materials, shapes, relative layouts, and so forth of the constituent parts and members are for illustrative examples, and do not intend to limit the invention therein. In addition, some of the sizes, positional relationships, and so forth of the members shown in the respective drawings may be exaggerated for clarity. Furthermore, the same names and symbols indicate the same members or members having the same qualities in the following description, and detailed descriptions thereof are therefore omitted.

Figure 1A:
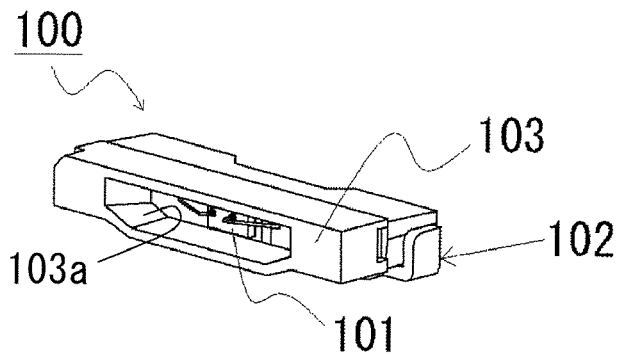
FIGS. 1A to 1D show a semiconductor light emitting device according to an embodiment of the present invention.

As shown in FIG. 1A, for example, a semiconductor device 100 according to the present invention comprises mainly a semiconductor element 101, a lead frame 102 one end of which functions as a lead terminal, and a package 103.

Semiconductor Element

Examples of the semiconductor element 101 according to the present invention include a light emitting element, a photodetector, and the like, and an LED chip used as a light emitting element is employed in the present embodiment as the semiconductor element 101.

In the light emitting device (e.g., the semiconductor device 100) according to the present invention, not only one but also a plurality of light emitting elements may be mounted. In this case, a plurality of light emitting elements with the same emission color may be used in combination, or a plurality of light emitting elements with different emission colors may be used in combination. For example, the color reproducibility can be improved by combining a plurality of light emitting elements having different emission colors in combination, so as to correspond to RBG. The luminous intensity can be improved when a plurality of light emitting elements with the same emission color are combined.

A protective element other than a light emitting element may also be mounted either singularly or plurally in the semiconductor device 100 according to the present invention. The protective element is not specifically limited and any known type that is mounted in light emitting devices may be used. Specific examples thereof include protective circuitries against over-heating, overvoltage, and overcurrent, and protective elements against static electricity.

Lead Frame

The lead frame 102 is an electrode used for electrically connecting to a light emitting element (e.g., the semiconductor element 101). The lead frame is only needed to be generally planar so that it may have a corrugated or patterned indented plate shape. The material thereof is not specifically limited, and forming the lead frame 102 with a material having relatively high thermal conductivity is preferable. When the lead frame 102 is formed with such a material, heat generated in the light emitting element can be released effectively. A preferable material has, for example, a thermal conductivity of about 200 W/(m·K) or higher, a relatively high mechanical strength, or a facility in processing such as punching and etching. Specific examples include metals such as copper, aluminum, gold, silver, tungsten, iron, and nickel, and alloys such as iron-nickel and phosphor bronze. Also, a reflective plating is preferably applied on the surface of the lead frame 102 so as to effectively extract light from the light emitting element to be mounted. The size, thickness, shape, and so force of the lead frame 102 can be suitably adjusted based on the size and shape of the light emitting device to be obtained. The lead frame 102 may be processed to bend at an exterior part of the package 103. Therefore, weld flash and the like is preferably removed from a part of the lead frame 102 that will be in contact with a wall of the package 103 or that will be arranged near the package 103, and the edge portion thereof is preferably rounded. With this arrangement, the lead terminal can be processed as desired without damaging the shape of the package 103.

The material, shape, size, thickness, and so forth of the lead frame 102 are not specifically limited, but the material and so forth are needed to be such that the lead frame 102 is capable of supplying a proper amount of electric power to the light emitting element.

Figure 1B:
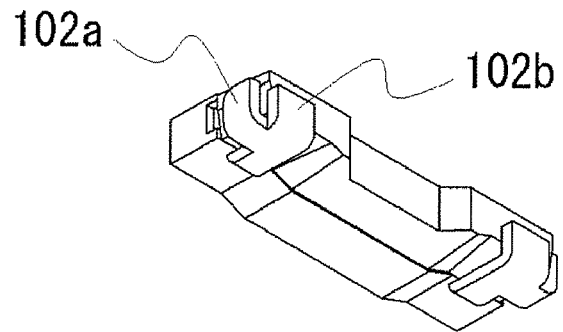
Figure 1C:
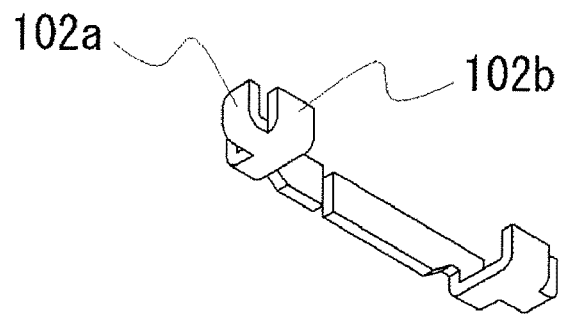

As shown in FIGS. 1B and 1C, the lead frames 102 are protruding outwardly from the package 103, each of the lead frames 102 is branched into a plurality of end portions 102a and 102b, and each of the end portions 102a and 102b is bent along the package 103. This allows providing a wider lead surface area even in a very thin type semiconductor device so that heat dissipation can be improved. The end portion 102a of the lead frame 102 that is bent along a side surface of the package 103 is generally used as a fillet terminal. With the arrangement described above, a terminal (e.g., the end portion 102b) other than the fillet terminal and also usable as a fillet terminal can be provided on the back side of the package 103 so as to connect with a metal member. Thus, a new heat releasing route other than the mounting surface can be provided.

Moreover, when such a light emitting device (e.g., the semiconductor device 100) is incorporated into an optical member such as an optical waveguide, an opening side of the package 103 can be appressed to the optical member or the like by pressing the terminal (e.g., the end portion 102b) arranged on the back side of the package 103 by means of an elastic member and the like. Therefore, a greater spring constant can be obtained than that obtained by pressing a deformable package resin, so that a semiconductor device having an excellent degree of adhesion with other members can be formed without using an adhesive material. The arrangement described above eliminates the need for an adhesive material and the like between the optical waveguide and the light emitting device (e.g., the semiconductor device 100), so that light can be introduced directly in the optical waveguide without absorbed in the adhesive material and the like, so that the incident efficiency of light can be enhanced.

Further, a new heat releasing route can be provided when the elastic member and the like is made from a metal-based material, so that a light emitting device can be realized in which deterioration in quantity of light due to heat can be suppressed low.

Moreover, if the end portion 102b of the lead frame 102 is bent at 90 degrees to the back surface side of the package 103 so as to be substantially in parallel with the opening portion of the front side of the package 103 that is the light emitting surface of the light emitting device as shown in FIG. 1C, the light emitting device can be fixed substantially in parallel with an optical member.

Also, if the end portion 102b disposed at the back surface side of the package is set with a larger surface area, heat dissipation can be further improved, which allows the semiconductor device to be fixed to other members with ease. Particularly, there has been a need for reducing the thickness of a side emission type semiconductor light emitting device as shown in FIG. 1, so that the end portion 102a disposed on a side surface has to be smaller (e.g., the end portion 102a on the side surface has a smaller surface area than the end portion 102b on the back surface). In the semiconductor device 100 according to the present invention, the surface area of the terminal can be increased significantly by disposing the terminal so as to be branched on the back surface side of the package 103 as well. Thus, fixation of the package 103 with other members and heat dissipation can be significantly improved.

The shape of each of the end portions 102a and 102b of the terminal disposed on the back surface side and either a side surface side or the bottom surface side is not specifically limited and appropriately adjusted in view of the spatial configuration, locational configuration or the like. For example, a shape having rounded corners, a T-shape, or a home plate shape may be employed as well as a quadrangular shape.

Package

The package 103 may be formed of any material as long as it is capable of protecting the semiconductor element 101 and allowing the lead frames 102 integrally attached thereon, and securing electrical insulation of the light emitting element (e.g., semiconductor element 101) and the lead frames 102. For example, thermoplastic resins, thermosetting resins, and so forth can be used, specific examples of which include polyphthalamide (PPA), polycarbonate resin, polyphenylene sulfide (PPS), liquid crystal polymer (LCP), ABS resin, epoxy resin, acrylic resin, PBT resin, and other such resins, and ceramics. Various kinds of dyes, pigments, or the like may also be mixed into these materials as coloring agents or light diffusing agents. This arrangement allows controlling the amount of light absorbed into the package 103 to a minimum, or rendering high reflectivity to a white package. Examples of coloring agents include $Cr_2O_3$, $MnO_2$, $Fe_2O_3$, and carbon black, and examples of light diffusing agents include calcium carbonate, aluminum oxide, and titanium oxide. As shown in FIG. 1A, a light emitting opening 103a is defined in the front side of the package 103 and is generally provided with a light transmissive covering material. Therefore, in view of the adhesion between the package 103 and the light transmissive covering material when they are subjected to heat generated from the light emitting element or the like, it is preferable to select materials having a small difference in thermal expansion coefficients.

The thickness (A in FIG. 1D) of a portion of the package 103 defining the opening is preferably small to increase the amount of light extracted directly without being absorbed into the package 103. Total luminous flux of the light emitting device can be increased by increasing the amount of light extracted directly without hitting the package 103.

Figure 1D:
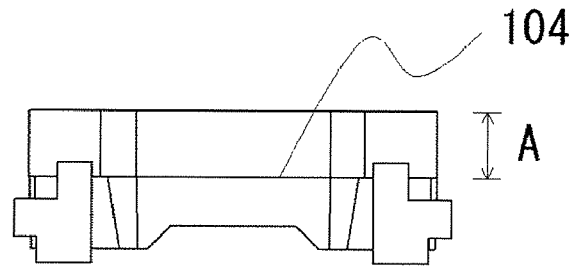

The package 103 can be formed by, for example, injecting a molten material described above into a mold, after the lead frames are inserted and the mold is closed, through a gate provided at a place corresponding to the back surface side of the package 103, and curing it. At this time, as shown in FIG. 1D, a linear, very slight protrusion 104 is formed along the external surface of the package 103 at the joining of the upper and lower molds.

The light emitting device (e.g., the semiconductor device 100) according to the present invention preferably has a light transmissive covering material in the opening in which the light emitting element (e.g., the semiconductor element 101) has been mounted. The light transmissive covering material is capable of protecting the light emitting element from external force, moisture, or the like, and also capable of protecting conductive wires which electrically connect the semiconductor element to the lead frames. Examples of the light transmissive material include light transmissive resins and glass having excellent weather resistance, such as epoxy resin, silicone resin, acrylic resin, urea resin. Particularly, when a light transmissive resin is employed, even in a case where moisture is incorporated in the light transmissive covering material during manufacture or storage, the moisture incorporated in the resin can be released into the ambient air by baking at 100° C. for at least 14 hours. Thus, steam explosion and separation of the light emitting element and molding member can be prevented.

A light-diffusing agent or a fluorescent material may be included in the light transmissive covering material. A light-diffusing agent diffuses light, so that directivity of light emitted from the light emitting element can be reduced and view angle can be increased. A fluorescent material converts light emitted from the light emitting element, so that it is capable of converting the wavelength of light emitted out of the package 103. If the light from the light emitting element is short wavelength visible light having high energy, various fluorescent materials can be suitably used, such as a perylene derivative which is an organic fluorescent material, and ZnCdS:Cu, YAG:Ce, and nitrogen contained $CaO-Al_2O_3-SiO_2$ activated with Eu and/or Cr which are inorganic fluorescent materials. If white light is intended to obtain with a use of a blue light emitting element in the present invention, particularly when YAG:Ce fluorescent material is used and according to the content thereof, yellowish light which is complementary color of blue light emitted from the light emitting element can be emitted by the fluorescent material which absorbs a portion of the blue light, so that white light can be created in a relatively easy way with good reliability. Similarly, when nitrogen contained $CaO-Al_2O_3-SiO_2$ activated with Eu and/or Cr fluorescent material is used and according to the content thereof, reddish light which is complementary color of blue light emitted from the light emitting element can be emitted by the fluorescent material which absorbs a portion of the blue light, so that white light can be created in a relatively easy way with good reliability. Also, if the fluorescent material is completely sedimented and air bubbles are removed, unevenness in color of light can be reduced.

Examples of the light emitting device (e.g., the semiconductor device 100) according to the present invention will now be described in detail below with reference to the accompanying drawings. It will be understood that the present invention is not limited to these specific examples.

EXAMPLE 1

Figure 2A:
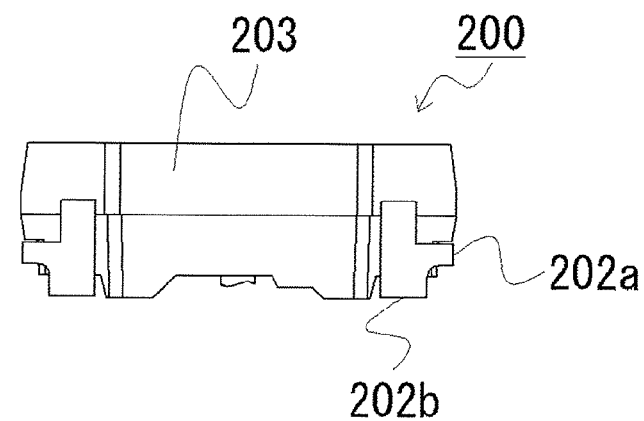
FIGS. 2A to 2E show a semiconductor light emitting device according to another embodiment of the present invention.
Figure 2B:
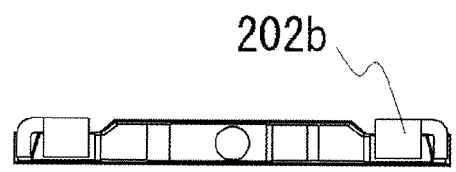
Figure 2C:
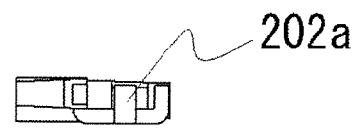
Figure 2D:
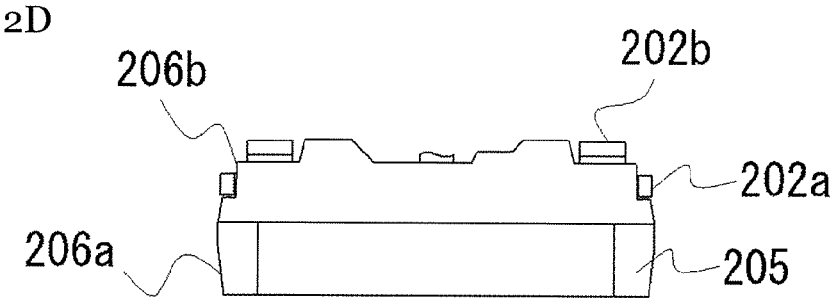
Figure 2E:
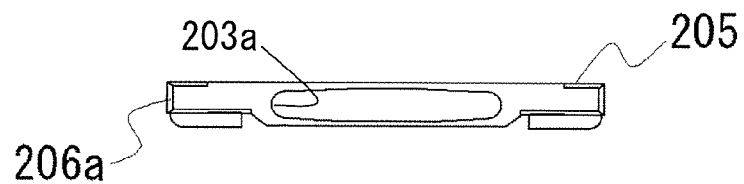
Figure 3A:
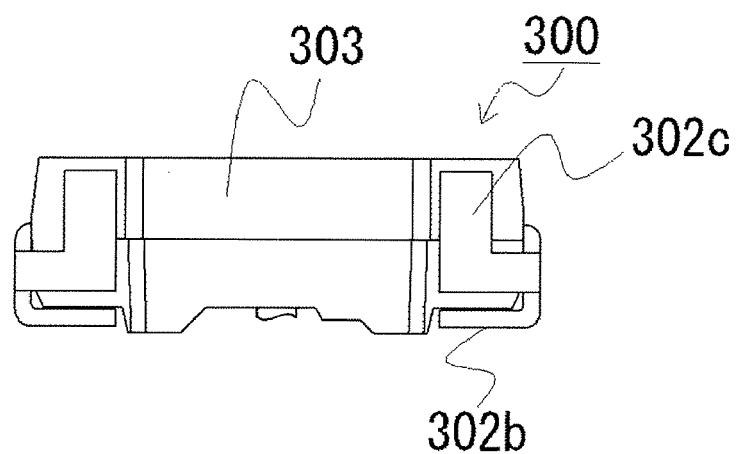
FIGS. 3A to 3E show a semiconductor light emitting device according to yet another embodiment of the present invention.
Figure 3B:
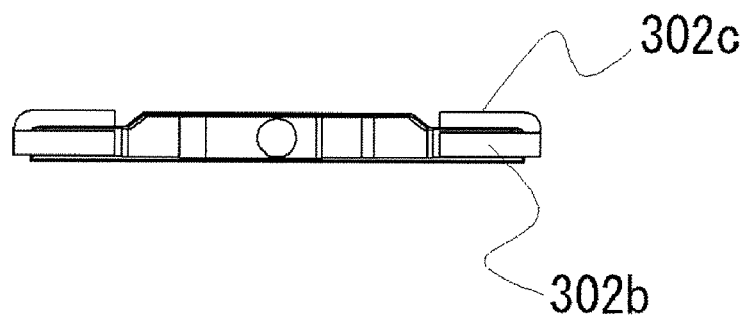
Figure 3C:
Figure 3D:
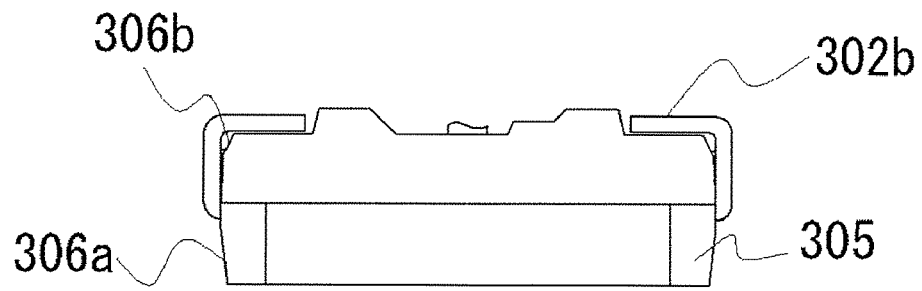
Figure 3E:
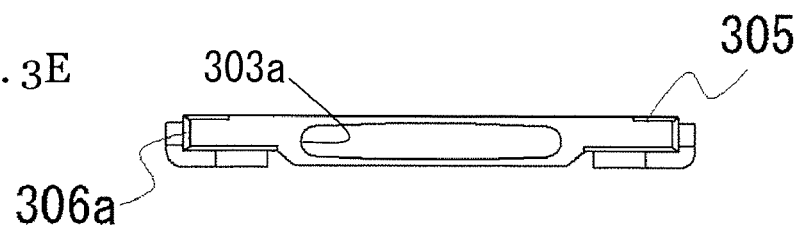

As shown in FIGS. 2A to 2E, the light emitting device 200 in the present example is a very thin, side-emission type semiconductor device with a thickness of about 0.4 mm. Respectively, FIG. 2A is a bottom view, FIG. 2B is a back view, FIG. 2C is a side view, FIG. 2D is a plan view, and FIG. 2E is a front view of the light emitting device 200.

The light emitting device 200 of the present example comprises a light emitting element (not shown), lead frames which are electrically connected with the light emitting element, a package 203 integrally fixing the lead frames.

The lead frames are formed into plate shape made of an alloy of copper containing iron, and a part of each lead frame protrudes outwardly from the bottom surface of the package 203 to function as a lead terminal. The surface of the lead frames are silver plated so as to extract light efficiently from the light emitting element that to be mounted.

Each of the lead frames functions as the lead terminal, and is branched into a plurality of end portions 202a and 202b at outside of the package 203. Each of the end portions 202a and 202b is bent along the side surface or the back surface of the package 203 respectively. The surface area of the end portions 202a bent and disposed on the side surface is, for example, about 0.062 $nm^2$ and the surface area of the end portions 202b bent and disposed on the back surface is about 0.134 $mm^2$. If a larger surface area for the end portions 202b is allowed at the back surface side, heat dissipation and adhesion with other members can be improved.

In the present example, the end portion 202b bent to the back surface side is bent at 90° so as to be substantially in parallel with the opening portion of the front side of the package 203 that is the light emitting surface of the light emitting device 200. Therefore, the light emitting device 200 can be fixed substantially in parallel with an optical member such as an optical waveguide. The end portion 202a on the side surface is also bent at 90°, but the degree is not necessary made to 90° to check the fillet, and it can be varied appropriately.

When a light emitting opening 203a is formed in a thin semiconductor device as in the present example, the wall portion defining the opening may become too thin to sustain mold releasing resistance at a time of removing the molded package from the metal mold, and thus the thin wall portion may be torn apart, making the package 203 nearly impossible to maintain the shape. Accordingly, a recess portion 205 is provided at the both ends of the front side of the package 203 as shown in FIG. 2D. Thus, mold releasing resistance of a metal mold can be reduced to a greater degree than would have been predicted, so that a light emitting device excellent in dimensional accuracy and easier handling can be obtained. Moreover, a draft angle or draft taper of approximately 2° to 5° is provided respectively on the portions 206a and 206b in FIG. 2D to reduce the mold releasing resistance.

In the light emitting device 200 according to the present example, as described above, the lead frame is branched into the end portions 202a and 202b, which provides a semiconductor device with excellent heat dissipation and adhesion with other members.

EXAMPLE 2

As shown in FIG. 3, the light emitting device 300 in the present example is a very thin, side-emission type semiconductor device with a thickness of about 0.4 mm. Respectively, FIG. 3A is a bottom view, FIG. 3B is a back view, FIG. 3C is a side view, FIG. 3D is a plan view, and FIG. 3E is a front view of the light emitting device.

The light emitting device 300 has a substantially similar structure as that in the light emitting device 200 in Example 1, except that each of the plurality of end portions 302b and 302c of each lead frame protruding from a side surface of the package 303 and branched out is bent along the bottom surface or the back surface of the package respectively. As mentioned above, the package 303 of the light emitting device 300 defines a light emitting opening 303a, a recess portion 305 and a draft angle at a portion 306a. The taper portion 306b in FIG. 3D can prevent interference between the lead and the package 303 at a time of bending the lead from the side surface to the back surface of the package 303, and also is capable of functioning as so-called draft angle or draft taper for reducing the mold releasing resistance of the metal mold.

In a similar manner as in Example 1, in the light emitting device 300, the lead frame is branched into the plurality of end portions 302a and 302b, which provides a semiconductor device with excellent heat dissipation and adhesion with other members.

EXAMPLE 3

Figure 4:
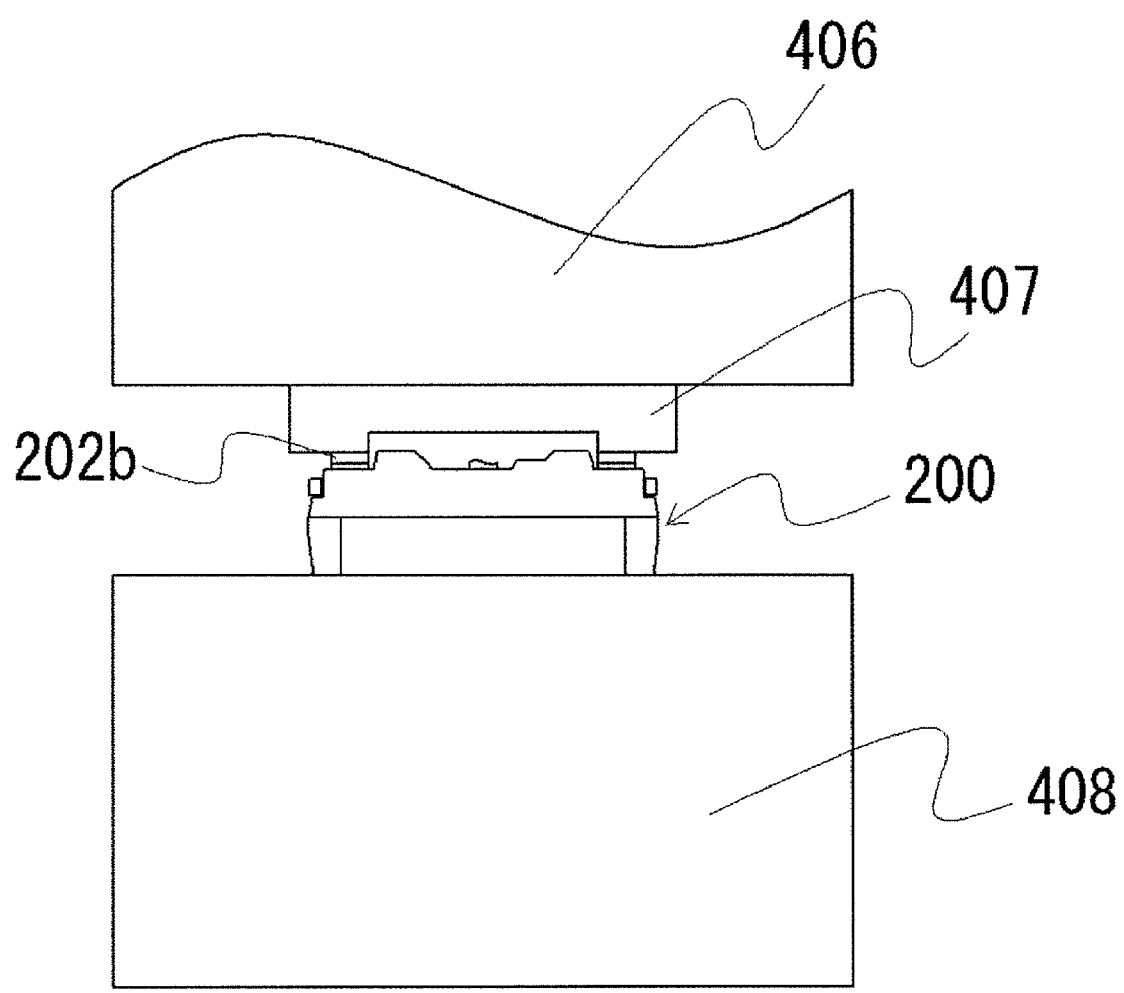
FIG. 4 is a schematic view showing a semiconductor light emitting device according to the embodiment of the present invention illustrated in FIGS. 2A to 2E being incorporated in a planar light source.

FIG. 4 is a schematic view showing the light emitting device 200 according to Example 1 of the present invention illustrated in FIG. 2 being incorporated in a planar light source. The end portion 202b at the back side of the light emitting device 200 is pressed by means of an elastic member, so that the incident portion of the optical waveguide 408 and the emission surface of the light emitting device are adhered.

As described above, a larger spring constant can be assigned if a lead terminal (e.g., the end portion 202b) which is a metal is provided at the portion to be pressed at when the light emitting device 200 is pressed to adhere to other members, and thus a light emitting device having excellent adhesion can be obtained. Moreover, stress applied to the resin package 203 when pressing the back surface of the package 203 can be reduced, so that a light emitting device of high reliability can be obtained.

The semiconductor device according to the present invention can be utilized for a light source of backlight for liquid crystal, a light source of various indicators, a panel meter, a display light, a surface luminous switch, and an optical sensor, or the like.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:
1. A semiconductor device comprising:
a semiconductor element;
a lead frame electrically connected to the semiconductor element; and
a package having a front surface including a light emitting opening, a back surface disposed on an opposite side of the package with respect to the front surface, a bottom surface extending between the front surface and the back surface on a bottom side of the package, and a side surface extending between the front surface and the back surface on a lateral side of the package, with a part of the lead frame protruding from the bottom surface of the package,
the protruding lead frame including a bottom portion extending generally along the bottom surface of the package, a side portion extending generally along the side surface of the package, and a back portion extending generally along the back surface of the package, with all of the bottom portion, the side portion and the back portion being disposed outside of the package.
2. The semiconductor device according to claim 1, wherein a surface area of the back portion extending generally along the back surface of the package is larger than a surface area of the side portion extending generally along the side surface of the package.
3. The semiconductor device according to claim 1, wherein the side portion of the protruding lead frame extends continuously from the bottom portion of the protruding lead frame, and
the back portion of the protruding lead frame extends continuously from the bottom portion of the protruding lead frame.
4. The semiconductor device according to claim 1, wherein the back portion of the protruding lead frame extends continuously from the bottom portion of the protruding lead frame with a bent angle of about 90 degrees being formed therebetween.
5. The semiconductor device according to claim 1, wherein the package further includes a top surface extending between the front surface and the back surface on a top side of the package, the front surface defining a pair of recess portions disposed in both lateral end parts of the package adjacent to the front surface.
6. A semiconductor device comprising:
a semiconductor element;

a lead frame electrically connected to the semiconductor element; and a package having a front surface including a light emitting opening, a back surface disposed on an opposite side of the package with respect to the front surface, a bottom surface extending between the front surface and the back surface on a bottom side of the package, and a side surface extending between the front surface and the back surface on a lateral side of the package, with a part of the lead frame protruding from the side surface of the package, the protruding lead frame including a side portion extending generally along the side surface of the package, a bottom portion extending generally along the bottom surface of the package, and a back portion extending generally along the back surface of the package, with all of the side portion the bottom portion and the back portion being disposed outside of the package.

7. The semiconductor device according to claim 6, wherein a surface area of the back portion extending generally along the back surface of the package is larger than a surface area of the bottom portion extending generally along the bottom surface of the package.

8. The semiconductor device according to claim 6, wherein the bottom portion of the protruding lead frame extends continuously from the side portion of the protruding lead frame, and the back portion of the protruding lead frame extends continuously from the side portion of the protruding lead frame.

9. The semiconductor device according to claim 6, wherein the back portion of the protruding lead frame extends continuously from the side portion of the protruding lead frame with a bent angle of about 90 degrees being formed therebetween.

10. The semiconductor device according to claim 6, wherein the package further includes a top surface extending between the front surface and the back surface on a top side of the package, the front surface defining a pair of recess portions disposed in both lateral end parts of the package adjacent to the front surface.

* * * * *